US010045434B2

United States Patent
Coletrane et al.

(10) Patent No.: US 10,045,434 B2
(45) Date of Patent: Aug. 7, 2018

(54) REDUCING IMPEDANCE DISCONTINUITIES ON A PRINTED CIRCUIT BOARD ('PCB')

(71) Applicant: LENOVO ENTERPRISE SOLUTIONS (SINGAPORE) PTE. LTD., Singapore (SG)

(72) Inventors: Candice L. Coletrane, Durham, NC (US); Bradley D. Herrman, Cary, NC (US)

(73) Assignee: Lenovo Enterprise Solutions (Singapore) Pte. Ltd., Singapore (SG)

(*) Notice: Subject to any disclaimer, the term of this patent is extended or adjusted under 35 U.S.C. 154(b) by 555 days.

(21) Appl. No.: 14/570,701

(22) Filed: Dec. 15, 2014

(65) Prior Publication Data

US 2016/0174359 A1  Jun. 16, 2016

(51) Int. Cl.
| H03H 7/38 | (2006.01) |
| H05K 1/02 | (2006.01) |
| H05K 1/11 | (2006.01) |

(52) U.S. Cl.
CPC ............ *H05K 1/0251* (2013.01); *H03H 7/38* (2013.01); *H05K 1/0222* (2013.01); *H05K 1/0245* (2013.01); *H05K 1/115* (2013.01); *H05K 2201/09645* (2013.01); *H05K 2201/09809* (2013.01)

(58) Field of Classification Search
CPC ..................................................... H03H 7/38
USPC ................................................... 333/33, 260
See application file for complete search history.

(56) References Cited

U.S. PATENT DOCUMENTS

| 3,757,272 | A | * | 9/1973 | Laramee | ................. | H01P 5/085 333/238 |
|---|---|---|---|---|---|---|
| 4,664,309 | A | | 5/1987 | Allen et al. | | |
| 6,388,208 | B1 | | 5/2002 | Kiani et al. | | |
| 6,711,814 | B2 | | 3/2004 | Barr et al. | | |
| 7,830,223 | B2 | | 11/2010 | Ahmad | | |
| 8,143,976 | B2 | | 3/2012 | Wyland | | |
| 8,541,883 | B2 | | 9/2013 | Cheng et al. | | |
| 2011/0298551 | A1 | | 12/2011 | Yen et al. | | |
| 2013/0056255 | A1 | | 3/2013 | Biddle et al. | | |
| 2013/0277858 | A1 | | 10/2013 | Sung et al. | | |

FOREIGN PATENT DOCUMENTS

WO   WO 2000/078104 A1   12/2000

* cited by examiner

*Primary Examiner* — Stephen E Jones
(74) *Attorney, Agent, or Firm* — Brandon C. Kennedy; Jason A. Friday; Kennedy Lenart Spraggins LLP

(57) ABSTRACT

A printed circuit board ('PCB') comprising: an interior socket configured to receive a connector pin of a first electronic component, the connector pin characterized by a pin impedance; a signal trace coupled to the interior socket, the signal trace configured to transmit electrical signals between the first electronic component and other electronic components mounted on the PCB, the signal trace characterized by a trace impedance; and an insulator between the interior socket and a sleeve that surrounds the interior socket, the sleeve physically configured such that an effective pin impedance matches the trace impedance within a predetermined threshold, wherein the effective pin impedance represents the resistance experienced by electrical signals passing through the connector pin when the connector pin is inserted into the interior socket.

8 Claims, 8 Drawing Sheets

REDUCING IMPEDANCE DISCONTINUITIES ON A PRINTED CIRCUIT BOARD ('PCB')

BACKGROUND OF THE INVENTION

Field of the Invention

The field of the invention is data processing, or, more specifically, methods, apparatus, and products for reducing impedance discontinuities on a PCB.

Description of Related Art

Modern computing systems can include electronic components that are mounted on a printed circuit board ('PCB'). Such electronic components may be mounted on a PCB though the use of one or more connector pins that are attached to the electronic component and inserted into one or more openings on the PCB. In addition to being useful to attach electronic components to the PCB, such connector pins may be used to transmit electrical signals between the attached electronic component and other electronic components mounted on the PCB, via signal traces on the PCB. In many cases, however, a connector pin impedance will differ from the line impedance characteristics of the signal traces on the PCB. This discontinuity causes undesired signal distortion.

SUMMARY OF THE INVENTION

A printed circuit board ('PCB') comprising: an interior socket configured to receive a connector pin, the connector pin characterized by a pin impedance; a signal trace coupled to the interior socket, the signal trace configured for transmitting a signal received from the connector pin via the interior socket, the signal trace characterized by a trace impedance; an insulator between the interior socket and a sleeve that radially surrounds the interior socket, the sleeve physically configured such that an effective pin impedance matches the trace impedance within a predetermined threshold, wherein the effective pin impedance represents the resistance experienced by the signal passing through the connector pin when the connector pin is inserted into the interior socket.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
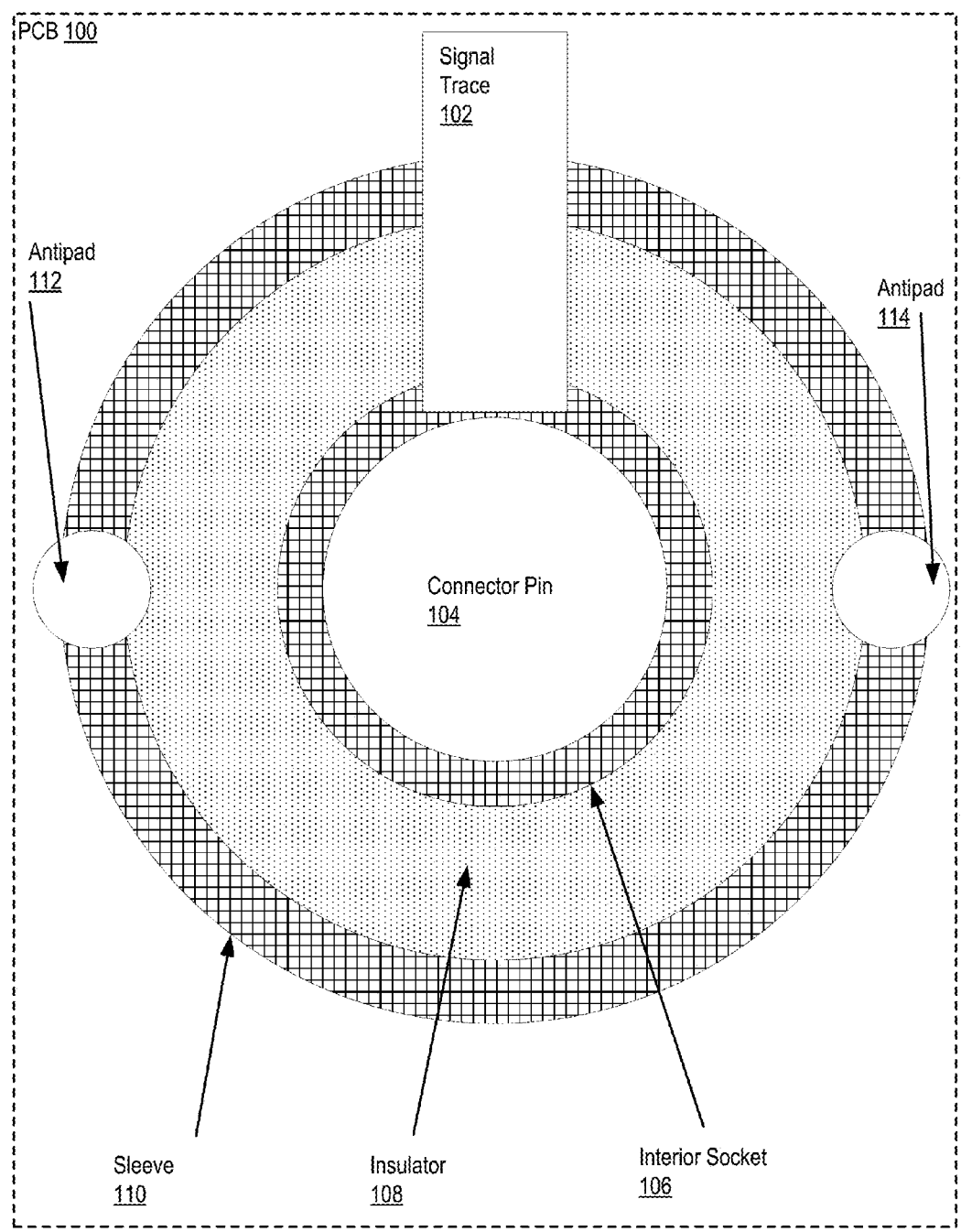
FIG. 1 sets forth a block diagram of a PCB according to embodiments of the present invention.

Example methods, apparatuses, and products for reducing impedance discontinuities on a PCB in accordance with the present invention are described with reference to the accompanying drawings, beginning with FIG. 1. FIG. 1 sets forth a block diagram of a PCB (100) according to embodiments of the present invention. In the example illustrated in FIG. 1, a top view of a PCB (100) is illustrated such that only a single layer of the PCB (100) is viewable. Readers will appreciate that additional layers of the PCB (100) may be included above and below the layer illustrated in FIG. 1.

The PCB (100) of FIG. 1 may be embodied as an apparatus that mechanically supports and electrically connects electronic components using conductive tracks, pads, and other features etched onto a non-conductive substrate. Such a PCB (100) can be single sided, double sided, or multi-layered and may include one or more via structures. Such via structures may be embodied as through-hole vias that are used to connect conductors on different layers of the PCB (100). The via structures may also be embodied to receive a connector pin (104) of an electronic component, in order to mount the electronic component on the PCB (100) and couple the electronic component to other electronic components mounted on the PCB (100) via one or more signal traces (102). Such a connector pin of an electronic component may be embodied, for example, as a conductive metal pin or other structure that is inserted into the via structure to mount the electronic component on the PCB The PCB (100) of FIG. 1 includes an interior socket (106) configured to receive a connector pin (104). The connecter pin (104) of FIG. 1 may be attached to an electronic component. Such an electronic component may be embodied as an integrated circuit ('IC') that may be packaged as a single in-line package ('SIP'), dual in-line package ('DIP'), and so on. The connector pin (104) of FIG. 1 may be characterized by a pin impedance that represents the opposition to a current flowing through the connector pin when a voltage is applied. As such, the pin impedance represents the extent to which electrical signals that pass through the connector pin (104) is electrically resisted. The pin impedance (Z), which is related to the square root of the ratio of the pin inductance (L) divided by pin capacitance (C) and can be calculated as $Z=(L/C)^{1/2}$, may be a function of physical attributes of the connector pin (104) such as, for example, the physical dimensions of the connector pin (104) and the materials used to construct and surround the connector pin (104).

In the example depicted in FIG. 1, the interior socket (106) may be made of a conductive material such as copper. The interior socket (106) may run between multiple layers of the PCB (100), such that the interior socket (106) is embodied as a plated wall of a hole that runs between two layers of the PCB (100). The interior socket (106) may be configured to support communications between multiple electronic components mounted on the PCB (100) as the interior socket (106) can receive a connector pin (104) from a first electronic component and can also provide an electrical path through which electrical signals may be passed to and from the first electronic component via the connector pin (104), the interior socket (106), and a signal trace (102). As such, the interior socket (106) is configured to operate as the signal path of the via structure depicted in FIG. 1.

As previously mentioned, the PCB (100) of FIG. 1 also includes a signal trace (102) that is coupled to the interior socket (106). The signal trace (102) depicted in FIG. 1 is electrically coupled to the interior socket (106) and is configured for transmitting electrical signals to and from the connector pin (104) via the interior socket (106). Such a signal trace (102) may be coupled to other via structures (not shown) that are used to couple other electronic components to the PCB (100), such that the signal trace (102) facilitates the exchange of electrical signals between multiple electronic components mounted on the PCB (100). The signal trace (102) of FIG. 1 may be embodied, for example, as an etched track on the PCB (100) that is used to transfer electrical signals between electronic components that are mounted on the PCB (100).

The signal trace (102) depicted in FIG. 1 may be associated with a trace characteristic impedance (Z) which is related to the square root of the ratio of the trace inductance (L) divided by trace capacitance (C) and can be calculated as $Z=(L/C)^{1/2}$. Such trace impedance is a measure of the opposition to which current flowing through the signal trace (102) faces when a voltage is applied. The trace impedance of the signal trace (102) therefore represents the opposition that an electrical signal faces when the electrical signal is flowing through the signal trace (102). The trace impedance of the signal trace (102) may be a function of the physical attributes of the signal trace (102) such as, for example, the geometry of the signal trace (102) and the materials used to construct the signal trace (102). The trace impedance of the signal trace (102) may also be a function of the physical attributes of other electronic devices that are coupled to the signal trace (102).

The PCB of FIG. 1 also includes a sleeve (110) that radially surrounds the interior socket (106) and thereby creates a coaxial structure. The sleeve (110) may be created by plating the interior walls of a hole that runs between one or more layers of the PCB (100) with a conductive metal such as copper. The sleeve (110) may be separated from the interior socket (106), for example, by an insulator (108). The insulator (108) depicted in FIG. 1 may be composed of a material whose internal electric charges do not flow freely, thereby making it very hard to conduct an electric current under the influence of an electric field. The insulator (108) may be composed, for example, of a rubber-like polymer, a plastic material, or other material sufficiently resistive to the flow of electrical current. In alternative embodiments, the insulator (108) may be embodied as an air gap such that air between the interior socket (106) and the sleeve (110) that radially surrounds the interior socket (106) serves as an insulator.

In the example method depicted in FIG. 1, the PCB (100) may be wired such that current flows through the sleeve (110). Current may flow through the sleeve (110), for example, by using the sleeve (110) as a return path that is coupled to ground, by connecting the sleeve to a power line, and so on. As such, the introduction of current to the sleeve (110) can cause the sleeve (110) to operate as a capacitor, thereby causing the sleeve (110) to produce a capacitance that impacts the effective impedance experienced by an electrical signal that is passing through the connector pin (104) that is located inside of the sleeve (110). The capacitance per unit length of such a coaxial structure is related to the inverse of ln(b/a) where b is the radius of the sleeve (110) and a is the radius of the interior socket (106).

The sleeve (110) of FIG. 1 is physically configured such that an effective pin impedance experienced by an electrical signal that is passing through the connector pin (104) matches the trace impedance within a predetermined threshold. In view of the fact that the sleeve (110) radially surrounds the connector pin (104) that is inserted into the interior socket (106), the capacitance of such a sleeve (110) will impact the impedance experienced by a signal that is passing through the connector pin (104). As such, the capacitance of the sleeve (110) can be used to adjust for differences between the pin impedance and the trace impedance, by impacting the impedance experienced by a signal that is passing through the connector pin (104) in such a way that the effective impedance experienced by a signal that is passing through the connector pin (104) is the same as the trace impedance experienced by a signal that is passing through the signal trace (102). Readers will appreciate that when the effective impedance experienced by a signal that is passing through the connector pin (104) is the same as the trace impedance experienced by a signal that is passing through the signal trace (102), signal integrity can be maintained when the signal is passed through the connector pin (104) to the signal trace (102).

The sleeve (110) may therefore be physically configured such that the sleeve (110) generates an amount of capacitance needed to compensate for the difference between the pin impedance and the trace impedance. For coaxial structure capacitance tuning can be accomplished by changing the distance between interior socket and the sleeve that radially surrounds the interior socket. For example, if the pin impedance is 20 Ohms and the trace impedance is 22 Ohms, the approach to reduce the capacitance and raise the impedance of the connector pin would be to increase the distance between the connector pin and the sleeve, and thus change the capacitance needed to compensate for the difference between the pin impedance and the trace impedance is an amount of capacitance that would cause the effective pin impedance to be 22 Ohms.

In such an example, the sleeve (110) may therefore be physically configured to generate a sufficient level of capacitance necessary to generate a capacitive reactance of a magnitude that compensates for the difference between the pin impedance and the trace impedance. Because the capacitance generated by the sleeve (110) is a function of the physical attributes of the sleeve (110) (e.g., the dielectric constant of the material between the interior socket and the sleeve, the surface area of the sleeve, the radius of the sleeve), the physical configuration attributes for the sleeve (110) may therefore be determined such that the sleeve (110) produces a capacitance necessary to generate a capacitive reactance to compensate for the difference between the pin impedance and the trace impedance.

The PCB (100) depicted in FIG. 1 includes a discontinuous sleeve (110) surrounding the interior socket (106). The coaxial structure previously described can be viewed as a collection of vertical conductive plates or strips. The sleeve (110) may be transformed into a 'discontinuous' sleeve (110), for example, by placing antipads (112, 114) on the sleeve that effectively break the sleeve into multiple plates, by performing back drilling operations to remove a portion of the sleeve and effectively break the sleeve into multiple plates, by removing portions of the sleeve to effectively break the sleeve into multiple plates, and so on. Removing the metal from the sleeve will modify the capacitance by reducing the surface area of the coaxial geometry shared between the connector pin (104) in the interior socket (106) and the sleeve (110). The discontinuous sleeve (110) may be physically configured such that an effective pin impedance matches the trace impedance within a predetermined threshold, for example, by the discontinuous sleeve (110) being physically configured to operate as a selective collection of parallel place capacitors that can impact the effective impedance, which is based on a ratio between pin inductance and the sum of parallel plate capacitance, experienced by a signal passing through the connector pin (104), such that the effective impedance experienced by a signal passing through the connector pin (104) matches the trace impedance of a signal passing through the signal trace (102), at least within a predetermined threshold.

Readers will appreciate that because the sleeve is discontinuous, the vertical strip segmented portions of the sleeve can effectively serve as parallel plates in a parallel plate capacitor, such that $C=\in rA/d$ where A is surface area and d is distance between parallel plates, or as stacks coaxial structure where the capacitance per unit length is $2\pi\in/\ln(b/a)$, where b is the sleeve's radius and a is the radius of the interior socket. In view of the fact that each parallel vertical strip plate that constitutes the sleeve (110) surrounds the connector pin (104) that is inserted into the interior socket (106), the capacitance of such a parallel plate capacitor will impact the impedance experienced by an electrical signal that is passing through the connector pin (104). As such, the capacitance of the parallel plate capacitors can be used to adjust for differences between the pin impedance and the trace impedance, by impacting the impedance experienced by a signal that is passing through the connector pin (104) in such a way that the effective impedance experienced by an electrical signal that is passing through the connector pin (104) is the same as the trace impedance experienced by an electrical signal that is passing through the signal trace (102). Readers will appreciate that when the effective impedance experienced by a signal that is passing through the connector pin (104) is the same as the trace impedance experienced by a signal that is passing through the signal trace (102), signal integrity can be maintained when the signal is passed through the connector pin (104) to the signal trace (102).

The discontinuous sleeve (110) may therefore be physically configured such that the discontinuous sleeve (110) generates an amount of capacitance needed to compensate for the difference between the pin impedance and the trace impedance. For example, if the pin impedance is 20 Ohms and the trace impedance is 22 Ohms, the amount of capacitance needed to compensate for the difference between the pin impedance and the trace impedance is an amount of capacitance that would cause the effective pin impedance to be 22 Ohms. Since the pin impedance is a function of a ratio of inductance divides by capacitance, impedance tuning can be accomplished by removing the metal surface area of the sleeve and reducing the number of parallel plate capacitors that can be formed between the interior socket (106) and the sleeve (110).

In such an example, the discontinuous sleeve (110) may therefore be physically configured to generate capacitance necessary to generate a capacitive reactance to compensate for the difference between the pin impedance and the trace impedance. Because the capacitance generated by the parallel plates of the discontinuous sleeve is a function of the physical attributes of the parallel plates (e.g., the dielectric constant of the material, the overlapping surface area of the plates, the distance between the plates), the physical configuration attributes for the discontinuous sleeve may therefore be determined such that the parallel plates produce a capacitance necessary to generate a capacitive reactance to compensate for the difference between the pin impedance and the trace impedance.

Figure 2:
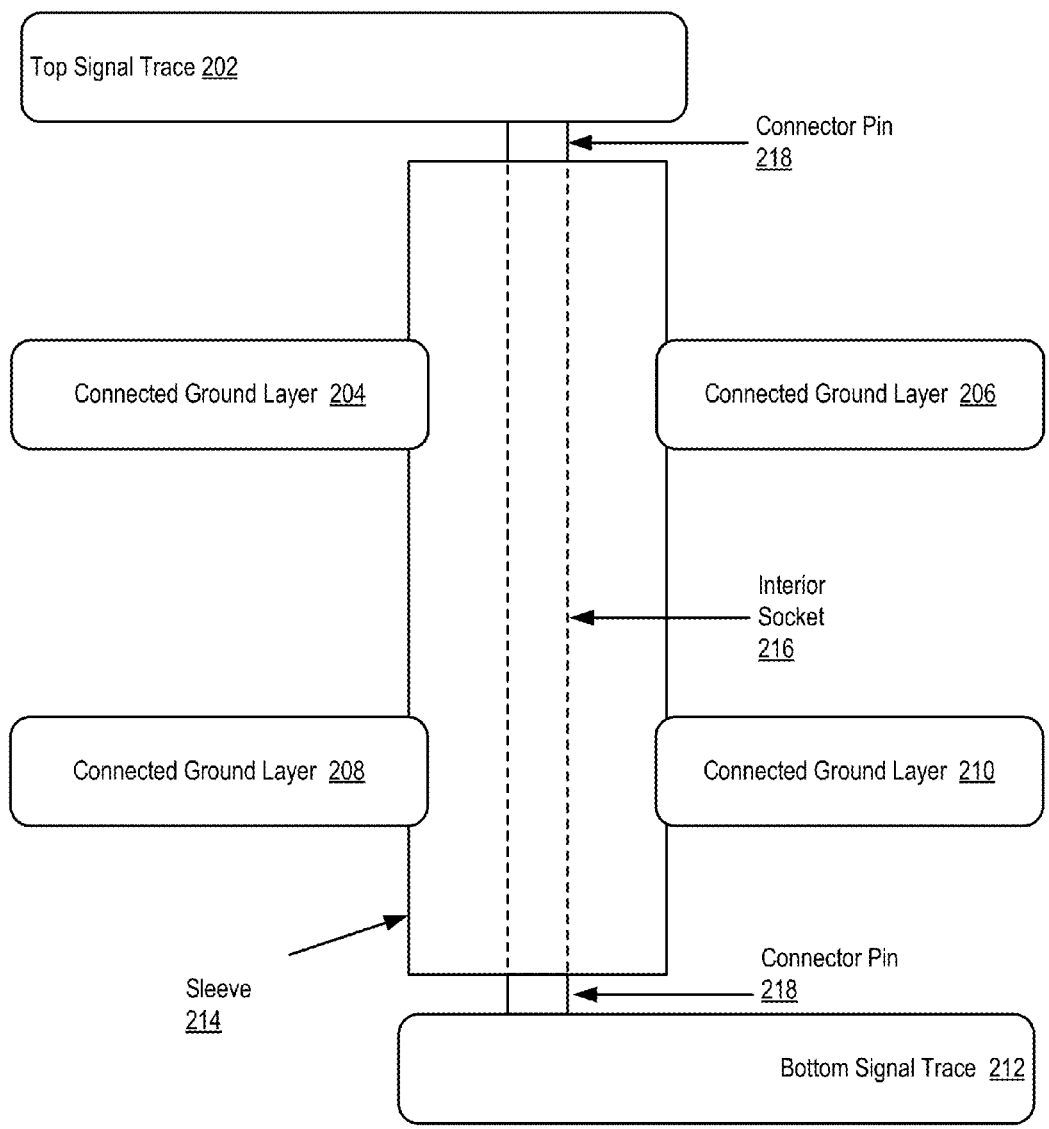
FIG. 2 sets forth a block diagram illustrating wiring details of a PCB according to embodiments of the present invention.

For further explanation, FIG. 2 sets forth a block diagram illustrating wiring details of a PCB according to embodiments of the present invention. The example depicted in FIG. 2 illustrates a side view of a coaxial structure and includes a solid sleeve (214) that can be similar to the sleeve depicted above with reference to FIG. 1. The example depicted in FIG. 2 represents a side-view of the sleeve (214) than can run through multiple layers of a PCB between signal traces (202, 212) on different layers of the PCB. The example depicted in FIG. 2 also includes an interior socket (216) that is running through the sleeve, with a portion of each end of a connector pin (218) inserted within the interior socket (216) extruding from the sleeve (216) to connect the interior socket (216) and the connector pin (218) contained therein to the signal traces (202, 212), without connecting the sleeve (214) to the signal traces (202, 212).

In the example depicted in FIG. 2, multiple ground layers (204, 206, 208, 210) are coupled to the sleeve (214). Each of the ground layers (204, 206, 208, 210) that are coupled to the sleeve (214) may be utilized to ground return signals as the sleeve (214) serves as the return path for signals. Readers will appreciate that in the example depicted in FIG. 2, each side of the sleeve (214) is connected to symmetrical connected ground layers (204, 206, 208, 210), such that the return signals pass through the sleeve uniformly, thereby impacting the manner in which capacitance is generated by the sleeve (214).

Figure 3:
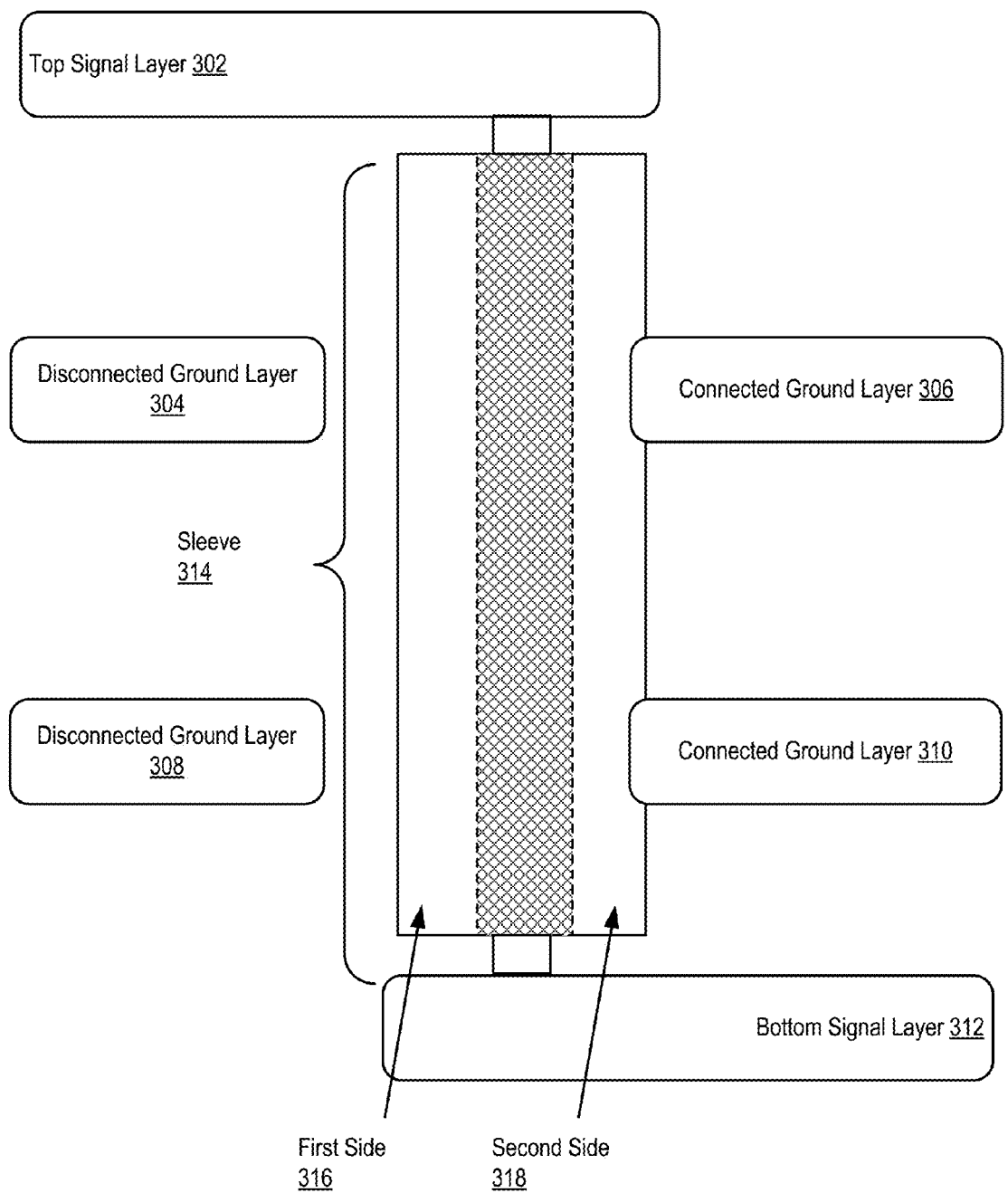
FIG. 3 sets forth a block diagram illustrating wiring details of a PCB according to embodiments of the present invention.

For further explanation, FIG. 3 sets forth a block diagram illustrating wiring details of a PCB according to embodiments of the present invention. The example depicted in FIG. 3 illustrates a discontinuous sleeve (314) that can be similar to the sleeve depicted above with reference to FIG. 1. The example depicted in FIG. 3 represents a side-view of the discontinuous sleeve (314) than can run through multiple layers of a PCB between signal traces (302, 312) on different layers of the PCB. The discontinuous sleeve (314) includes a first side (316) and a second side (318) that can be generated, for example, by back drilling or otherwise removing material from the sleeve (314), illustrated herein by hatching, thereby producing two plates that operate as a parallel plate capacitor. Since the pin impedance is a function of a ratio of inductance divides by capacitance, impedance tuning can be accomplished by removing the metal surface area from the wall of the sleeve.

In the example depicted in FIG. 3, multiple ground layers (304, 306, 308, 310) are present in the PCB but only two ground layers (306, 310) are coupled to the sleeve (314). More specifically, two ground layers (306, 310) are coupled only to one side (318) of the sleeve (314), such that only one side (318) of the sleeve (314) is utilized to ground return signals when the sleeve (314) serves as the return path for electrical signals. Readers will appreciate that in the example depicted in FIG. 3, the return signals do not pass through the sleeve uniformly, thereby impacting the manner in which capacitance is generated by the sleeve (314).

Figure 4:
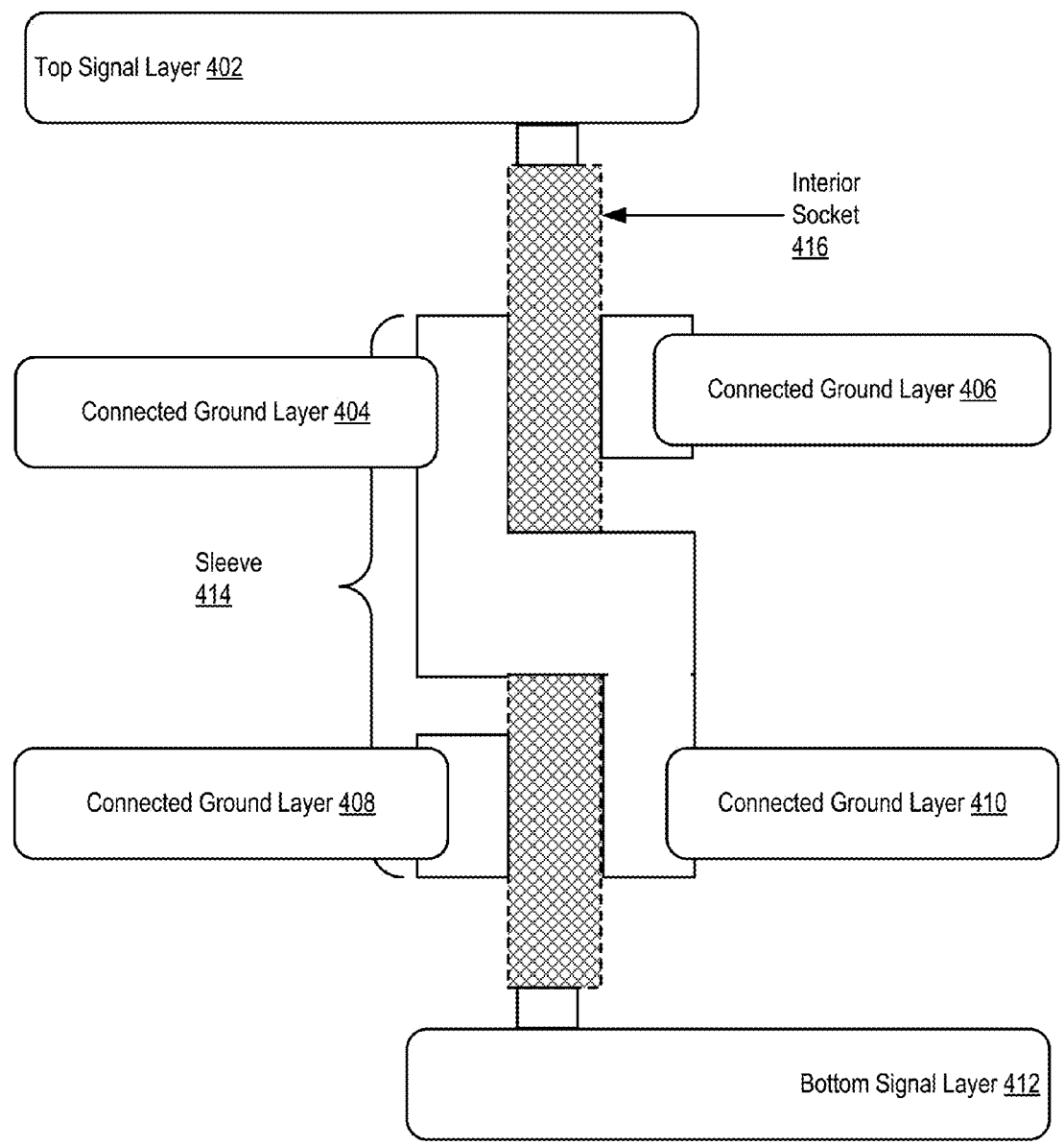
FIG. 4 sets forth a block diagram illustrating wiring details of a PCB according to embodiments of the present invention.

For further explanation, FIG. 4 sets forth a block diagram illustrating wiring details of a PCB according to embodiments of the present invention. The example depicted in FIG. 4 illustrates a discontinuous sleeve (414) that can be similar to the sleeve depicted above with reference to FIG. 1. The example depicted in FIG. 4 represents a side-view of the discontinuous sleeve (414) than can run through multiple layers of a PCB between signal traces (402, 412) on different layers of the PCB. The discontinuous sleeve (414) can be generated, for example, by back drilling or otherwise removing material from the sleeve (414), thereby leaving in place material to form a sleeve (414) that effectively wraps around the interior socket (416). This approach of extending the length of return current path, twisting the return path around the interior socket (416) and the connector pin contained therein, narrows the width of return path in an effort to raise inductance of the structure and raise the impedance of the connector pin.

Figure 5:
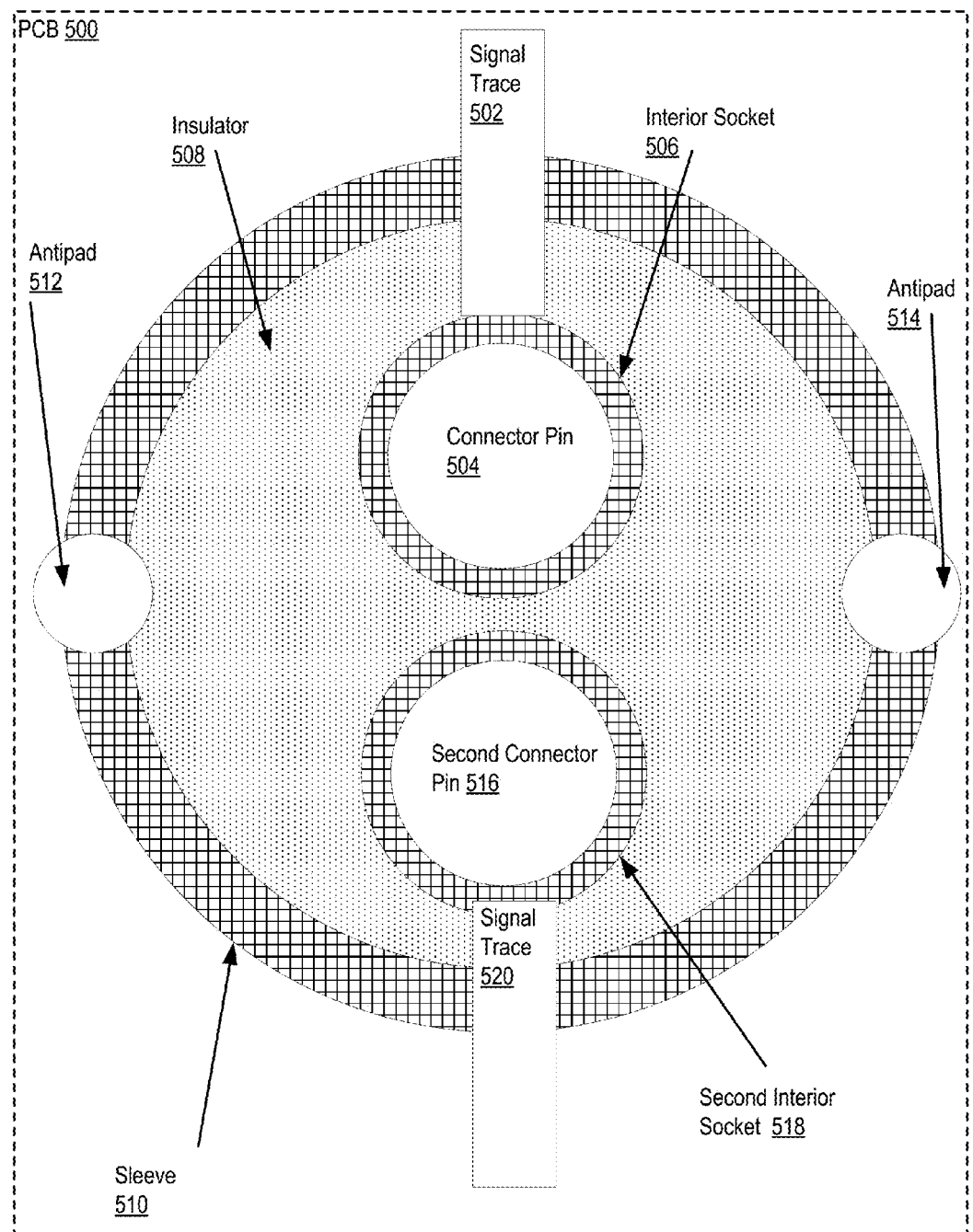
FIG. 5 sets forth a block diagram of a PCB according to embodiments of the present invention.

For further explanation, FIG. 5 sets forth a block diagram of a PCB (500) according to embodiments of the present invention. The PCB (500) of FIG. 5 is similar to the PCB depicted in FIG. 1, as the PCB (500) of FIG. 5 also includes a signal trace (502, 520), a connector pin (504), an interior socket (506), insulator (508), a sleeve (510), and antipads (512, 514). Each signal trace (502, 52) represents a structural path intended to carry two signals that propagate equal and opposite in magnitude and such signaling propagation mode is commonly referred to as a differential signal. The PCB (500) of FIG. 5 also includes a second interior socket (518) configured to receive a second connector pin (516). In the example depicted in FIG. 5, the second connector pin (516) may be configured to transport electrical signals in a direction that is opposite to a direction that the connector pin (504) transports electrical signals. For example, if the connector pin (504) is configured to receive incoming electrical signals that are directed to an electronic component that is mounted on the PCB (500), the second connector pin (516) may be configured to transmits outgoing electrical signals that are generated by an electronic component that is mounted on the PCB (500). Readers will appreciate that in the example depicted in FIG. 5, the flow of electrical signals through the second connector pin (516) will impact the impedance experienced by electrical signals flowing in the opposite direction through the connector pin (504). As such, the second connector pin (516) and the second interior socket (518) may therefore be used to impact the effective impedance experienced by signals passing through the connector pin (504).

Figure 6:
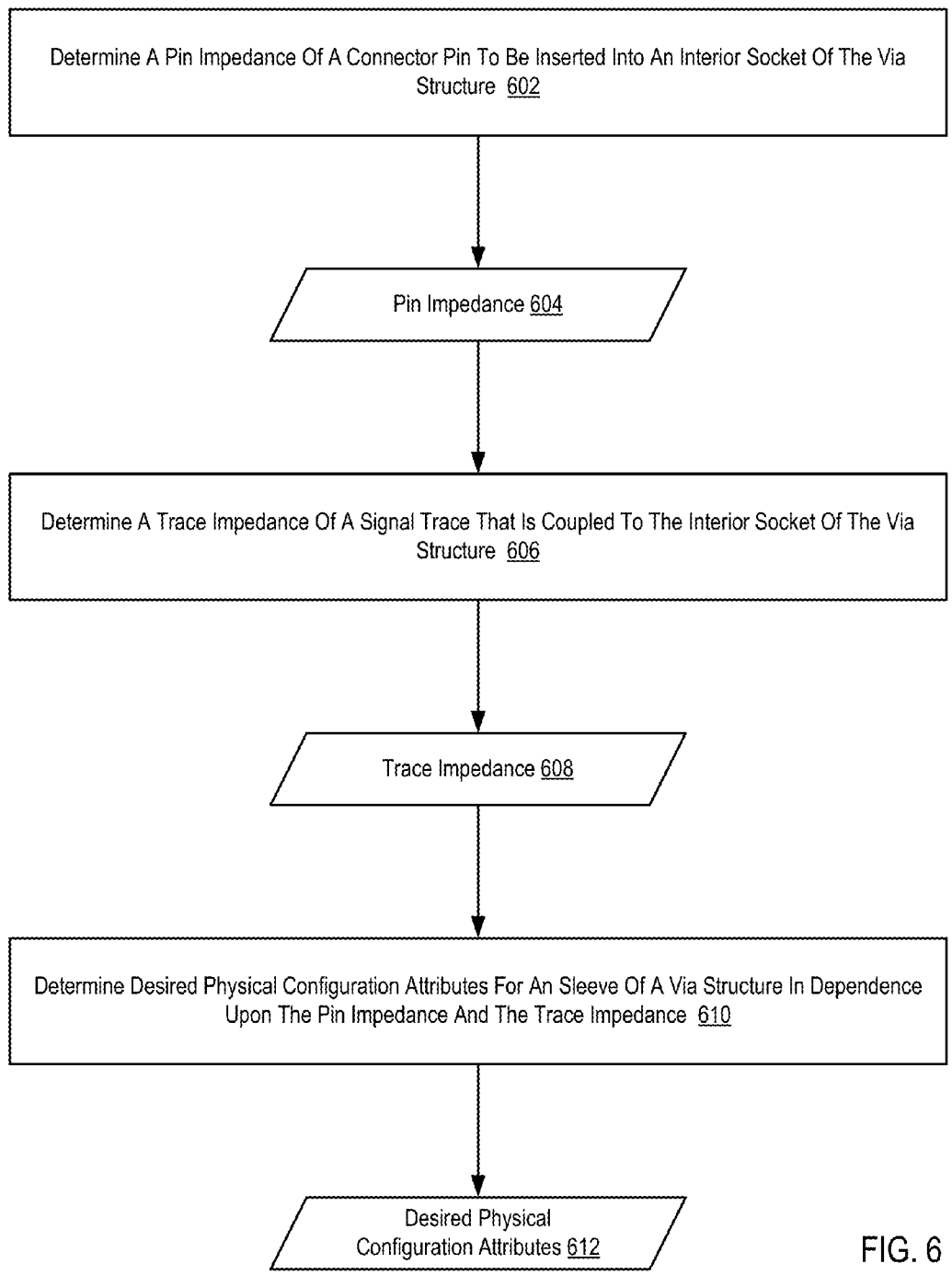
FIG. 6 sets forth an example method of reducing impedance discontinuities on a PCB according to embodiments of the present invention.

For further explanation, FIG. 6 sets forth an example method of reducing impedance discontinuities on a PCB according to embodiments of the present invention. The example method depicted in FIG. 6 includes determining (602) a pin impedance (604) of a connector pin that is inserted into an interior socket of a via structure. The pin impedance (604) of a connector pin is a measure of the opposition to which current flowing through the connector pin faces when a voltage is applied. The pin impedance (604) of the connector pin therefore represents the opposition that an electrical signal faces when the electrical signal is flowing through the connector pin. In the example method depicted in FIG. 6, the pin impedance (604) of the connector pin is a function of the physical attributes of the connector pin such as, for example, the geometry of the connector pin and the materials used to construct the connector pin. As such, the pin impedance (604) of the connector pin represents the characteristic impedance of the connector pin itself.

The example method depicted in FIG. 6 also includes determining (606) a trace impedance (608) of a signal trace that is coupled to the interior socket of the via structure. The trace impedance (608) of the signal trace that is coupled to the interior socket of the via structure is a measure of the opposition to which current flowing through the signal trace faces when a voltage is applied. The trace impedance (608) of the signal trace therefore represents the opposition that an electrical signal faces when the electrical signal is flowing through the signal trace. In the example method depicted in FIG. 6, the trace impedance (608) of the signal trace is a function of the physical attributes of the signal trace such as, for example, the geometry of the signal trace and the materials used to construct the signal trace. The trace impedance (608) may also be a function of the physical attributes of other electronic devices that are coupled to the signal trace.

The example method depicted in FIG. 6 also includes determining (610) desired physical configuration attributes (612) for a sleeve of the via structure. In the example method depicted in FIG. 6, the sleeve of the via structure may be created by plating the interior walls of a hole that runs between multiple layers of the PCB with a conductive metal such as copper.

In the example method depicted in FIG. 6, the desired physical configuration attributes (612) for the sleeve of the via structure are determined (610) in dependence upon the pin impedance (604) and the trace impedance (608). More specifically, the desired physical configuration attributes (612) for the sleeve of the via structure are determined (610) such that the sleeve operates as a capacitor that can impact the effective impedance experienced by an electrical signal passing through the connector pin, such that the effective impedance experienced by an electrical signal passing through the connector pin matches the trace impedance (608), at least within a predetermined threshold.

In the example method depicted in FIG. 6, determining (610) desired physical configuration attributes (612) for the sleeve of the via structure in dependence upon the pin impedance (604) and the trace impedance (608) may be carried out, for example, by determining the amount of capacitance needed to compensate for the difference between the pin impedance (604) and the trace impedance (608).

Capacitance tuning can be accomplished by adjusting the distance between the interior socket and the sleeve, or by removing metal from the sleeve wall. For example, if the pin impedance (604) was 20 Ohms and the trace impedance (608) was 22 Ohms, the amount of capacitance needed to compensate for the difference between the pin impedance (604) and the trace impedance (608) would be an amount of capacitance that would cause the effective pin impedance to be 22 Ohms.

In such an example, the desired physical configuration attributes (612) for the sleeve may therefore be determined (610) to generate a capacitance necessary to generate a capacitive reactance to compensate for the difference between the pin impedance (604) and the trace impedance (608). Because the capacitance generated by the sleeve is a function of the physical attributes of the sleeve, the physical configuration attributes (612) for the sleeve may therefore be determined (610) such that the sleeve produces a capacitance necessary to generate a capacitive reactance to compensate for the difference between the pin impedance (604) and the trace impedance (608).

Figure 7:
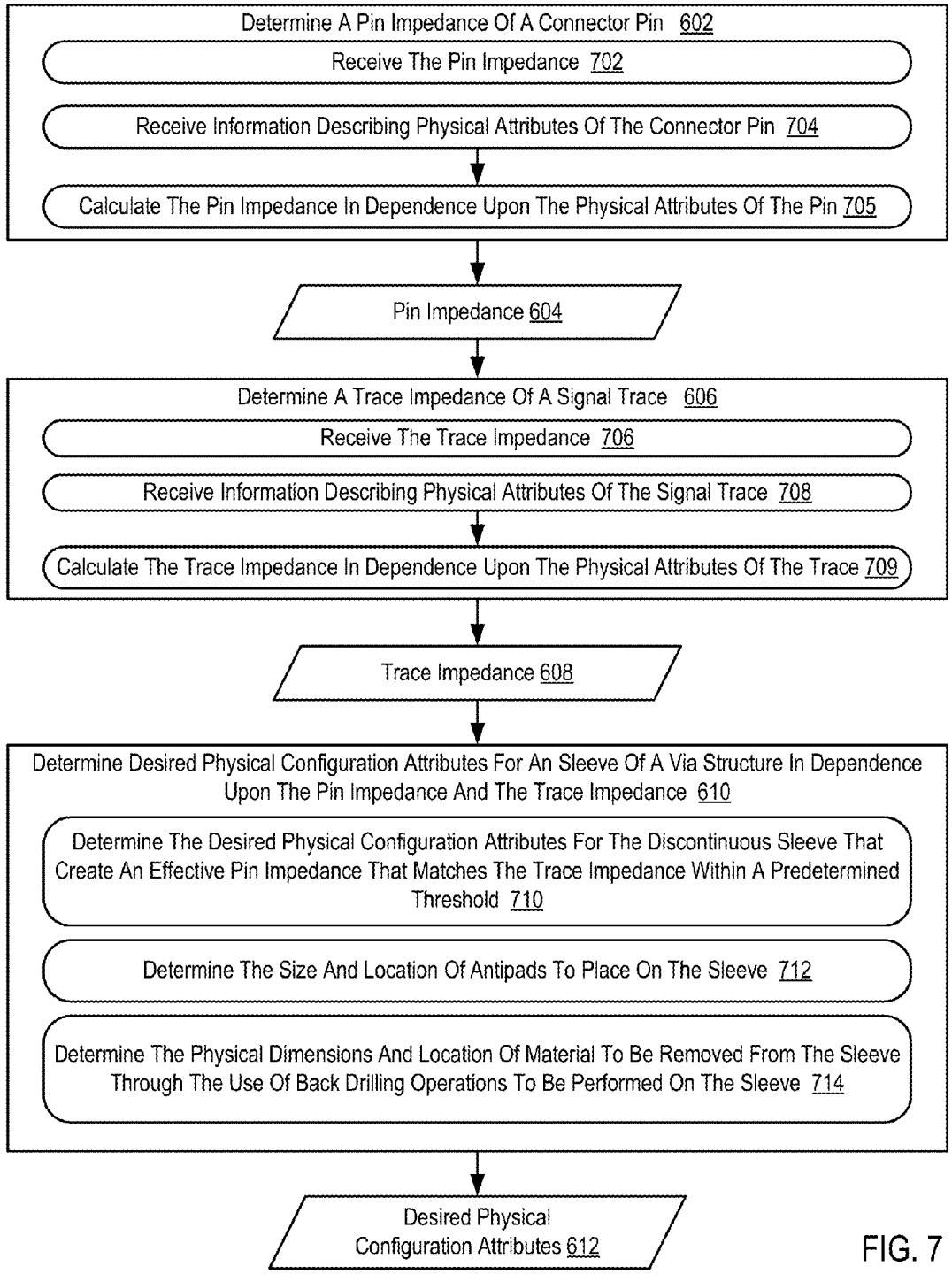
FIG. 7 sets forth an additional example method of reducing impedance discontinuities on a PCB according to embodiments of the present invention.

For further explanation, FIG. 7 sets forth an additional example method for reducing impedance discontinuities on a PCB according to embodiments of the present invention. The example method depicted in FIG. 7 is similar to the example method depicted in FIG. 6, as the example method depicted in FIG. 7 also includes determining (602) a pin impedance (604) of a connector pin to be inserted into an interior socket of a via structure, determining (606) a trace impedance (608) of a signal trace that is coupled to the interior socket of the via structure, and determining (610) desired physical configuration attributes (612) for a sleeve of the via structure in dependence upon the pin impedance (604) and the trace impedance (608).

In the example method depicted in FIG. 7, determining (602) a pin impedance (604) of a connector pin inserted into an interior socket of a via structure can include receiving (702) the pin impedance (604) of the connector pin. The pin impedance (604) of the connector pin may be included, for example, as part of a set of specifications for an electronic component that is to be mounted on the PCB using the connector pin. As such, receiving (702) the pin impedance (604) of the connector pin may be carried out by extracting such information from the specifications for an electronic component that is to be mounted on the PCB using the connector pin, by a system administrator extracting such information from the specifications for an electronic component that is to be mounted on the PCB using the connector pin, and so on.

In the example method depicted in FIG. 7, determining (602) a pin impedance (604) of a connector pin to be inserted into an interior socket of a via structure can also include receiving (704) information describing physical attributes of the connector pin. Such physical attributes of the connector pin can include, for example, the material used to construct the connector pin, the dielectric constant of the material used to construct the connector pin, the physical dimensions of the connector pin, and so on. In such a way, by receiving a sufficient set of physical attributes of the connector pin, the pin impedance (604) of the connector pin can be calculated (705) as the pin impedance (604) of the connector pin is a function of the physical attributes of the connector pin.

In the example method depicted in FIG. 7, determining (606) a trace impedance (608) of a signal trace that is coupled to the interior socket of the via structure can include receiving (706) the trace impedance (608). The trace impedance (608) of the signal trace may be included, for example, as part of a set of specifications for a PCB. As such, receiving (706) the trace impedance (608) may be carried out by extracting such information from the specifications for the PCB, by a system administrator extracting such information from the specifications for the PCB, and so on.

In the example method depicted in FIG. 7, determining (606) a trace impedance (608) of a signal trace that is coupled to the interior socket of the via structure can also include receiving (708) information describing physical attributes of the signal trace. Such physical attributes of the signal trace can include, for example, the material used to construct the signal trace, the dielectric constant of the material used to construct the signal trace, the physical dimensions of the signal trace, and so on. In such a way, by receiving a sufficient set of physical attributes of the signal trace, the trace impedance (608) of the signal trace can be calculated (706) as the trace impedance (608) of the signal trace is a function of the physical attributes of the signal trace.

In the example method depicted in FIG. 7, determining (610) the desired physical configuration attributes (612) for a sleeve of the via structure in dependence upon the pin impedance (604) and the trace impedance (608) can include determining (710) the desired physical configuration attributes for the sleeve that create an effective pin impedance that matches the trace impedance within a predetermined threshold. In the example method depicted in FIG. 7, the effective pin impedance represents the resistance experienced by a signal passing through the connector pin when the connector pin is inserted into the interior socket of the via structure.

In the example method depicted in FIG. 7, determining (610) the desired physical configuration attributes (612) for a sleeve of the via structure in dependence upon the pin impedance (604) and the trace impedance (608) can also include determining (712) the size and location of antipads to place on the sleeve. Readers will appreciate that the sleeve may be constructed using a standard size, standard material, and so on. As such, the physical configuration attributes (612) for the sleeve may be modified through the use of antipads placed one on or more layers of the PCB that effectively alter the size and geometrical configuration of the sleeve.

In the example method depicted in FIG. 7, determining (610) the desired physical configuration attributes (612) for a sleeve of the via structure in dependence upon the pin impedance (604) and the trace impedance (608) can also include determining (714) the physical dimensions and location of material to be removed from the sleeve through the use of back drilling operations or other processes to be performed on the sleeve. Readers will appreciate that the sleeve may be constructed using a standard size, standard material, and so on. As such, the physical configuration attributes (612) for the sleeve may be modified through the use of back drilling operations or other material removal processes to be performed on the sleeve that effectively alter the size and geometrical configuration of the sleeve.

Figure 8:
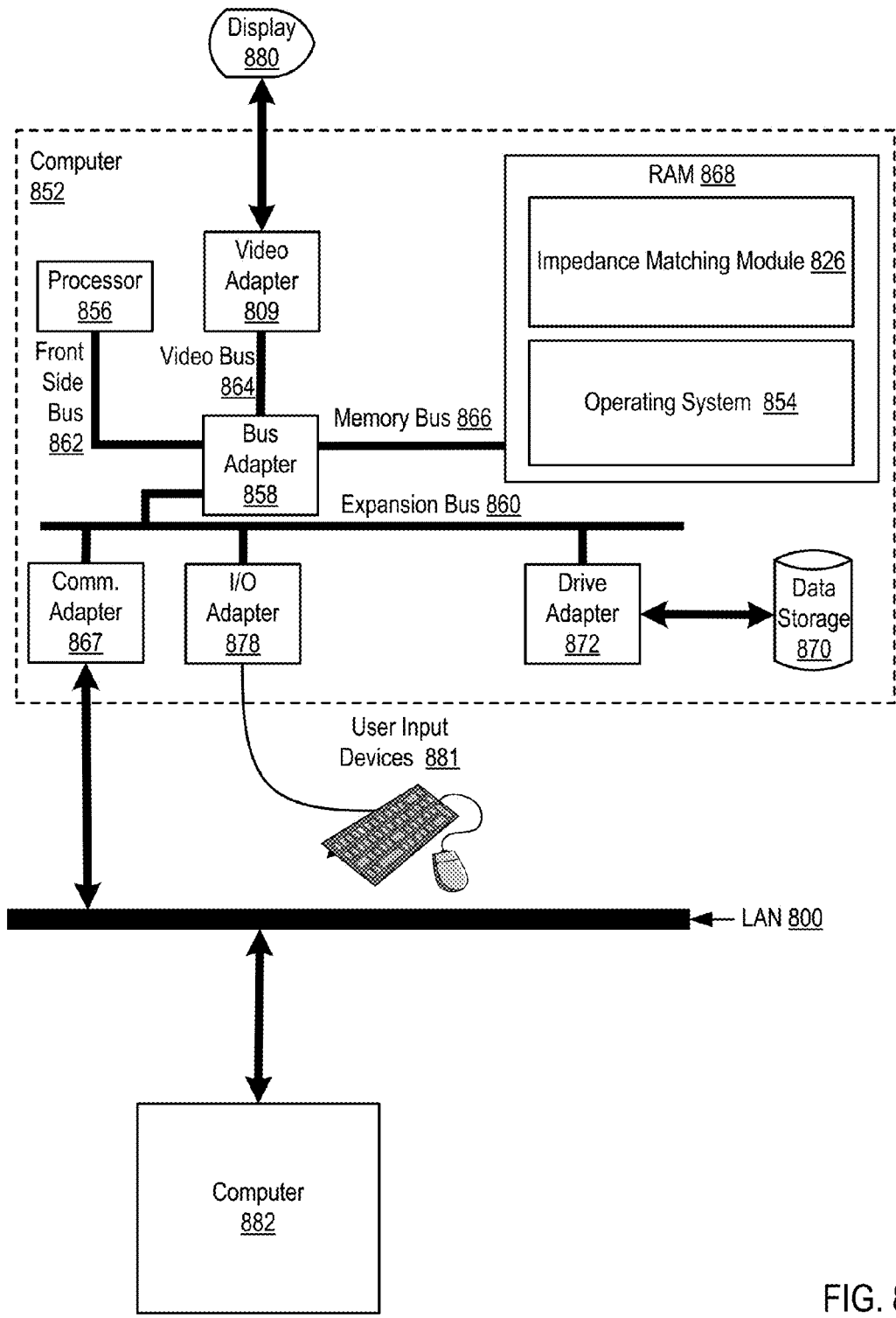
FIG. 8 sets forth a block diagram of automated computing machinery comprising an example computer useful in reducing impedance discontinuities on a PCB according to embodiments of the present invention.

For further explanation, FIG. 8 sets forth a block diagram of automated computing machinery comprising an example computer (852) useful in reducing impedance discontinuities on a PCB according to embodiments of the present invention. The computer (852) of FIG. 8 includes at least one computer processor (856) or 'CPU' as well as random access memory (868) ('RAM') which is connected through a high speed memory bus (866) and bus adapter (858) to processor (856) and to other components of the computer (852).

Stored in RAM (868) is an impedance matching module (826), a module of computer program instructions for useful in reducing impedance discontinuities on a PCB according to embodiments of the present invention. The impedance matching module (826) of FIG. 8 may be configured to reduce impedance discontinuities on a PCB according to embodiments of the present invention by determining a pin impedance of the connector pin to be inserted into an interior socket of the via structure; determining a trace impedance of the signal trace that is coupled to the interior socket of the via structure; and determining desired physical configuration attributes for a sleeve of a via structure in dependence upon the pin impedance and the trace impedance.

Also stored in RAM (868) is an operating system (854). Operating systems useful matching an impedance of a connector pin and an impedance of a signal trace on a PCB according to embodiments of the present invention include UNIX™, Linux™, Microsoft XP™, AIX™, IBM's i5/OS™, and others as will occur to those of skill in the art. The operating system (854) and the impedance matching module (826) in the example of FIG. 8 are shown in RAM (868), but many components of such software typically are stored in non-volatile memory also, such as, for example, on a disk drive (870).

The computer (852) of FIG. 8 includes disk drive adapter (872) coupled through expansion bus (860) and bus adapter (858) to processor (856) and other components of the computer (852). Disk drive adapter (872) connects non-volatile data storage to the computer (852) in the form of disk drive (870). Disk drive adapters useful in computers for matching an impedance of a connector pin and an impedance of a signal trace on a PCB according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (852) of FIG. 8 includes one or more input/output ('I/O') adapters (878). I/O adapters implement user-oriented input/output through, for example, software drivers and computer hardware for controlling output to display devices such as computer display screens, as well as user input from user input devices (881) such as keyboards and mice. The example computer (852) of FIG. 8 includes a video adapter (809), which is an example of an I/O adapter specially designed for graphic output to a display device (880) such as a display screen or computer monitor. Video adapter (809) is connected to processor (856) through a high speed video bus (864), bus adapter (858), and the front side bus (862), which is also a high speed bus.

The example computer (852) of FIG. 8 includes a communications adapter (867) for data communications with other computers (882) and for data communications with a data communications network (800). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for matching an impedance of a connector pin and an impedance of a signal trace on a PCB according to embodiments of the present invention include modems for wired dial-up communications, Ethernet (IEEE 802.3) adapters for wired data communications network communications, and 802.11 adapters for wireless data communications network communications.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A printed circuit board ('PCB') comprising:
an interior socket configured to receive, in an interior opening, a connector pin of a first electronic component, the connector pin characterized by a pin impedance;
a signal trace coupled to the interior socket, the signal trace configured to transmit electrical signals between the first electronic component and other electronic components mounted on the PCB, the signal trace characterized by a trace impedance; and
a sleeve radially surrounding said interior socket and an insulator between the interior socket and the sleeve, the sleeve physically configured by removing portions of the sleeve to alter the capacitance of the sleeve such that an effective pin impedance matches the trace impedance within a predetermined threshold, wherein the effective pin impedance represents the resistance experienced by electrical signals passing through the connector pin when the connector pin is inserted into the interior socket.

2. The PCB of claim 1 wherein the PCB is wired such that the sleeve is a signal path.

3. The PCB of claim 1 wherein the PCB is wired such that the sleeve is a return path.

4. The PCB of claim 1 wherein the sleeve is a discontinuous sleeve.

5. The PCB of claim 4 wherein the PCB is wired such that current flows through only one portion of the discontinuous sleeve.

6. The PCB of claim 4 wherein the PCB is wired such that a return current path provided by the discontinuous sleeve wraps around the interior socket.

7. The PCB of claim 1 further comprising a second interior socket configured to receive a second connector pin.

8. The PCB of claim 7 wherein the second connector pin transports electrical signals in a direction that is opposite to a direction that the connector pin transports electrical signals.

* * * * *